(12) United States Patent
Engel

(10) Patent No.: US 6,331,773 B1
(45) Date of Patent: Dec. 18, 2001

(54) PINNED SYNTHETIC ANTI-FERROMAGNET WITH OXIDATION PROTECTION LAYER

(75) Inventor: Bradley N. Engel, Louisville, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 09/293,039

(22) Filed: Apr. 16, 1999

(51) Int. Cl.$^7$ .......................... H01L 43/08; G01R 33/09; G11B 5/39; G11C 19/08
(52) U.S. Cl. ...................... 324/252; 338/32 R; 360/324; 428/611
(58) Field of Search .................. 324/252; 338/32 R; 428/611, 692, 693; 360/324, 324.11, 324.12

(56) References Cited

U.S. PATENT DOCUMENTS

| | | |
|---|---|---|
| 5,159,513 | 10/1992 | Dieny et al. . |
| 5,206,590 | 4/1993 | Dieny et al. . |
| 5,287,238 | 2/1994 | Baumgart et al. . |
| 5,343,422 | 8/1994 | Kung et al. . |
| 5,408,377 | 4/1995 | Gurney et al. . |
| 5,422,571 | 6/1995 | Gurney et al. . |
| 5,465,185 | 11/1995 | Heim et al. . |
| 5,475,304 | 12/1995 | Prinz . |
| 5,492,720 | 2/1996 | Gill et al. . |
| 5,508,866 | 4/1996 | Gill et al. . |
| 5,534,355 | 7/1996 | Okuno et al. . |
| 5,616,370 | 4/1997 | Okuno et al. . |
| 5,686,838 | 11/1997 | van den Berg . |
| 5,701,223 | 12/1997 | Fontana, Jr. et al. . |
| 5,748,399 | 5/1998 | Gill . |
| 5,768,071 | 6/1998 | Lin . |
| 5,825,595 | 10/1998 | Gill . |
| 5,849,422 | 12/1998 | Hayashi . |
| 6,038,107 | * 3/2000 | Pinarbasi ............................ 360/113 |

* cited by examiner

Primary Examiner—Walter Snow
(74) Attorney, Agent, or Firm—Brooks & Kushman P.C.

(57) ABSTRACT

Good magnetic, wear, and corrosion properties are required of a pinned synthetic anti-ferromagnet used in a top spin valve magnetoresistive sensor for reading magnetic media. The pinned synthetic anti-ferromagnet includes a synthetic anti-ferromagnet. An oxidation protection layer is deposited on the synthetic anti-ferromagnet. A nickel oxide layer for pinning the synthetic anti-ferromagnet is deposited on the oxidation layer.

16 Claims, 6 Drawing Sheets

PINNED SYNTHETIC ANTI-FERROMAGNET WITH OXIDATION PROTECTION LAYER

TECHNICAL FIELD

The present invention relates to pinned synthetic anti-ferromagnets that may be used in top spin valve magnetoresistive sensors.

BACKGROUND ART

Information is written onto magnetic media by magnetizing regions with a particular strength and orientation. These regions generate a magnetic field which can be converted into an electrical signal by sensors located in a read head. A common type of read sensor, adaptable to small geometries through thin film processing techniques, exhibits a change in resistance to varying strengths of magnetic fields. Small read sensor geometries are necessary in achieving increasingly greater information areal density on magnetic media.

A simple magnetoresistive (MR) sensor consists of a thin film of magnetoresistive material, such as Permalloy, between two insulating layers. When the MR layer is formed, a magnetic field is typically applied in a direction parallel to the plane of the thin layer. Thus, the MR layer exhibits a uniaxial anisotropy with an easy-axis of magnetization parallel to the direction of the applied field. If an external magnetic field, such as produced by magnetized regions on moving magnetic media, is applied normal to the easy-axis, the magnetization direction of the MR layer will rotate away from the easy-axis and towards the direction of the applied magnetic field. This magnetization rotation causes a change in resistance in the MR layer. To compensate for non-linearities, the MR sensor is often biased with an applied current such that a zero magnitude applied field results in a resistance near an inflection point on the resistance curve. Thus, small changes about a zero magnitude applied external field result in nearly linear changes in resistance. One difficulty with this simple MR design is the low percentage change in resistance for the level of flux commonly exhibited by moving magnetic media. This low sensitivity results in a high susceptibility to noise and limits the reduction of track size on the magnetic media.

Greater sensitivity may be achieved using a laminate structure of at least two uncoupled ferromagnetic layers with each pair of ferromagnetic layers separated by a non-ferromagnetic metal layer. The scattering of charge in current flowing through the structure is dependent on an induced spin direction. The giant magnetoresistive (GMR) effect results from varying the spin direction in one of the ferromagnetic layers. A read sensor results when the orientation of the free ferromagnetic layer is changed due to externally applied fields from the passing magnetic media.

An application of the GMR effect is the spin valve magnetoresistive (SVMR) sensor. In an SVMR sensor, one ferromagnetic layer is pinned. This pinning may be accomplished by placing an anti-ferromagnetic layer in contact with the pinned ferromagnetic layer. Many designs for SVMR sensors exist, including those described in U.S. Pat. Nos. 5,206,590 to Dieny et al. and 5,465,185 to Heim et al, both of which are incorporated by reference herein. In order to be effective, the SVMR sensor must possess several qualities. First, the exchange bias between the pinned ferromagnetic layer and the pinning anti-ferromagnetic layer must be great enough to rigidly pin the ferromagnetic layer against the small field excitations produced by the media and large demagnetizing fields resulting from the sensor geometry. Second, the device must have a low coercivity to prevent the pinned layer from becoming unstable in the presence of moderately strong applied fields. Third, if the magnetic media comes into contact with the read sensor as with magnetic tape, materials used in the sensor must have good wear properties.

Two SVMR sensor designs are described in U.S. Pat. No. 5,701,223 to flontaiia, Jr. et al. which is incorporated by reference herein. Both designs use a synthetic anti-ferromagnet as the pinned layer. A synthetic anti-ferromagnet is an ultra-thin laminate structure of coupled ferromagnetic films, each neighboring pair separated by a non-magnetic coupling film. By adjusting the thickness of the coupling film, the coupled ferromagnetic films become alternately aligned and anti-aligned. For example, a synthetic anti-ferromagnetic layer with anti-aligned ferromagnetic films may be constructed of ultra-thin layers of cobalt (Co) separated by a ruthenium (Ru) layer 2–8 Å thick. A pinned synthetic anti-ferromagnet is formed by placing an anti-ferromagnetic layer, such as nickel oxide (NiO) or iron-manganese (Fe—Mn), adjacent to one of the ferromagnetic films. Both designs disclosed utilize a pinned synthetic anti-ferromagnet. The designs differ in the order in which layers are formed and the material used for tile anti-ferromagnetic pinning layer.

The first design describes a bottom SVMR. In one embodiment, an NiO anti-ferromagnetic layer is deposited on a substrate layer. A synthetic anti-ferromagnet, consisting of an ultra-thin layer of Ru between ultra-thin layers of Co, is deposited on the NiO to form a pinned synthetic anti-ferromagnet. A spacer layer, such as copper (Cu), is deposited on the synthetic anti-ferromagnet. A nickel-iron (Ni—Fe) ferromagnetic layer is deposited on the spacer. An advantage with this design is the good wear properties of materials used. One problem with this design is the difficulty in achieving proper soft magnetic properties such as low coercivity, low anisotropy, and a well-defined magnetic axis in the free ferromagnetic layer without previously depositing a seed layer directly beneath the free layer. Another problem is the difficulty controlling the structure and surface quality of the NiO anti-ferromagnetic layer.

The second design described is the top SVMR sensor. A tantalum (Ta) seed layer is first deposited on the substrate. The Ni—Fe free ferromagnetic layer is deposited on the seed layer. A spacer layer is then deposited on the free ferromagnetic layer. The pinned synthetic anti-ferromagnet is then formed on the spacer. To make the pinned synthetic anti-ferromagnet, a Co/Ru/Co synthetic anti-ferromagnetic layer is first deposited. An Fe—Mn anti-ferromagnetic layer is then deposited on the synthetic anti-ferromagnetic layer. The use of a seed layer maintains the soft magnetic properties of the NiFe free ferromagnetic layer. However, the Fe—Mn used for the pinning anti-ferromagnetic layer has inferior wear properties and corrosion resistance.

What is needed is a synthetic anti-ferromagnet that is easy to produce using thin-film manufacturing techniques. A top SVMR should be able to be produced with this pinned synthetic anti-ferromagnet that exhibits a high exchange bias between the synthetic anti-ferromagnet and is constructed of materials with good wear properties and corrosion resistance.

DISCLOSURE OF INVENTION

It is an object of the present invention to provide a pinned synthetic anti-ferromagnet that can be easily manufactured.

It is another object of the present invention to provide a pinned synthetic anti-ferromagnet formed by the deposition of a nickel oxide anti-ferromagnet layer that does not oxidize a coupled ferromagnetic film.

It is still another object of the present invention to provide a top spin valve magnetoresistive sensor having an oxidized anti-ferromagnetic pinning layer that has good wear properties and corrosion resistance.

It is yet another object of the present invention to provide a top spin valve magnetoresistive sensor by deposition of an oxidized anti-ferromagnetic layer that has high exchange bias between the synthetic anti-ferromagnetic layer and the pinning oxidized anti-ferromagnetic layer.

It is a further object of the present invention to provide a top spin valve magnetoresistive sensor with low coercivity.

It is a still further object of the present invention to provide a top spin valve magnetoresistive sensor with an oxidized anti-ferromagnetic pinning layer that is formed without oxidizing a coupled ferromagnetic film.

In carrying out the above objects and other objects and features of the present invention, a pinned synthetic anti-ferromagnet is provided. The pinned synthetic anti-ferromagnet includes an oxidation protection layer deposited on the synthetic anti-ferromagnet. A nickel oxide layer is deposited on the oxidation layer to pin the synthetic anti-ferromagnet.

In an embodiment of the present invention, the oxidation protection layer includes nickel-iron. In a refinement, the oxidation protection layer is between 3 Å and 30 Å in thickness and is preferably 10 Å thick.

A top spin valve magnetoresistive sensor is also provided. The sensor includes a substrate. A laminate structure including a seed layer, a magnetically free layer on the seed layer, a spacer layer on the free layer, a magnetically pinned layer on the spacer layer, an oxidation protection layer on the pinned layer, and a magnetically pinning layer deposited on the oxidation protection layer is formed on the substrate.

A method of making a pinned synthetic anti-ferromagnet is provided. A synthetic anti-ferromagnet is formed. An oxidation protection layer is deposited on the synthetic anti-ferromagnet. A nickel oxide layer is deposited on the oxidation layer.

The above objects and other objects, features and advantages of the present invention are readily apparent from the following detailed description of the best mode for carrying out the invention when taken in connection with the accompanying drawings.

BEST MODE FOR CARRYING OUT THE INVENTION

Figure 1:
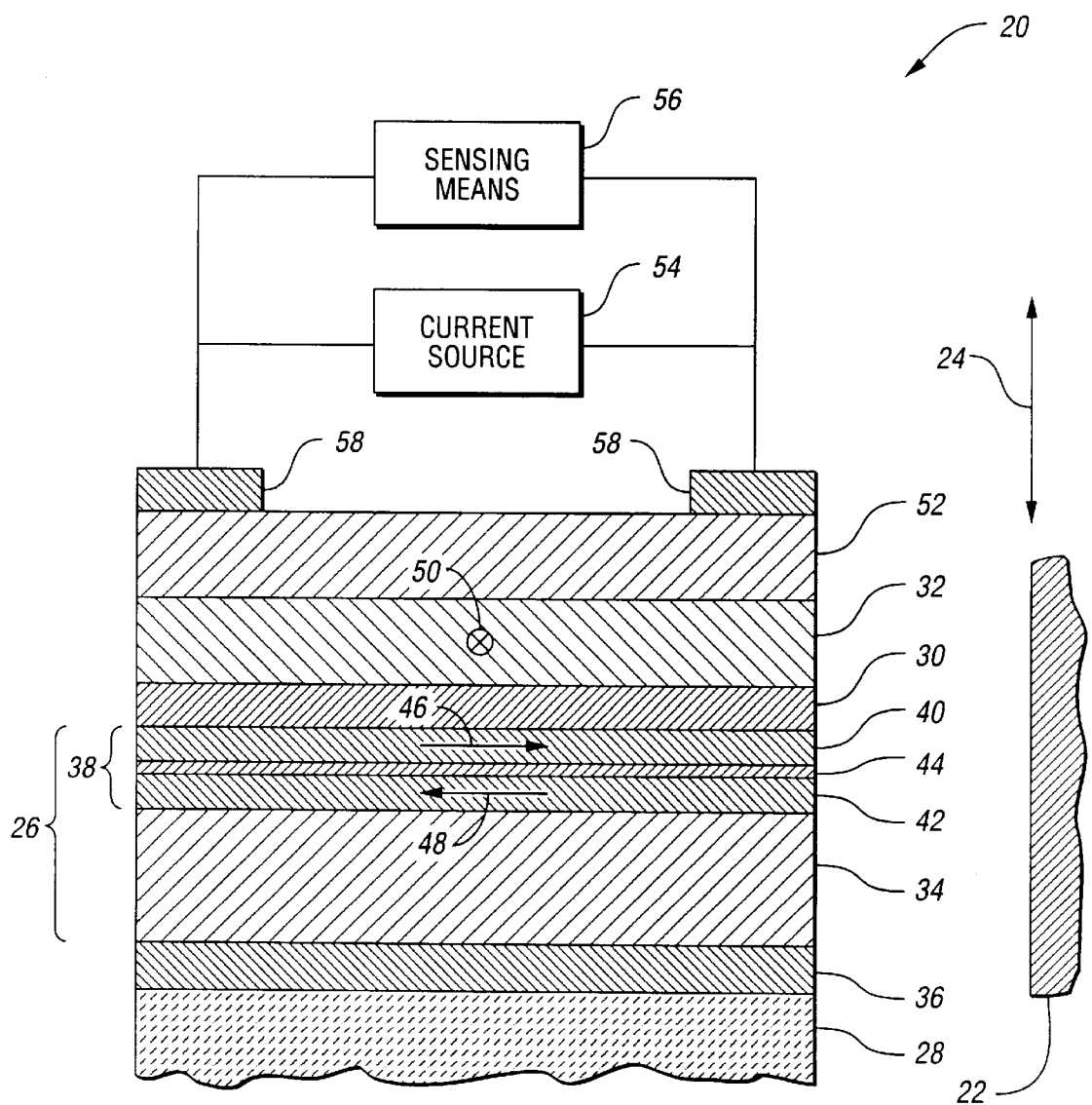
FIG. 1 is a conceptualized sectional view of a prior art bottom spin valve magnetoresistive sensor.

Referring to FIG. 1, a conceptualized sectional view of a prior art bottom spin valve magnetoresistive sensor is shown. A bottom spin valve magnetoresistive (SVMR) sensor, shown generally by 20, senses magnetic fields produced by magnetic media 22 moving relative to bottom SVMR sensor 20 in media direction 24. The structure, operation, and manufacture of bottom SVMR sensor 20 is disclosed in U.S. Pat. No. 5,701,223 to Fontana, Jr. et al. which is incorporated by reference herein. Bottom SVMR sensor 20 comprises pinned synthetic anti-ferromagnet 26 on substrate 28. Spacer layer 30 separates magnetically free layer 32 from pinned synthetic anti-ferromagnet 26.

Pinned synthetic anti-ferromagnet 26 includes pinning anti-ferromagnetic layer 34 which may be deposited directly on substrate 28 or on seed layer 36 first deposited on substrate 28. Pinned synthetic anti-ferromagnet 26 also includes synthetic anti-ferromagnetic layer 38 having first ferromagnetic layer 40 separated from second ferromagnetic layer 42 by coupling film 44. The thickness of coupling film 44 permits the magnetization direction of the first ferromagnetic layer, shown generally by arrow 46, to be anti-parallel to the magnetization direction of the second ferromagnetic layer, shown by arrow 48. Because the thicknesses of first ferromagnetic layer 40 and second ferromagnetic layer 42 are about the same and because the magnetization directions 46,48 are anti-parallel, the magnetic moments of layers 40,42 nearly cancel resulting in very little or essentially no magnetic moment in synthetic anti-ferromagnetic layer 38. This effectively amplifies the exchange field between pinning anti-ferromagnetic layer 34 and synthetic anti-ferromagnetic layer 38 above the level that would occur if synthetic anti-ferromagnetic layer 38 was replaced with a single ferromagnetic layer. This permits a material with a weaker exchange bias but better corrosion resistance such as NiO to be used for pinning anti-ferromagnetic layer 34.

Substrate 28 may be any material that provides the necessary support properties such as glass, a semiconductor, alumina ($Al_2O_3$), or the like. Optional seed layer 36 may be tantalum, zirconium, nickel-iron (NiFe), $Al_2O_3$, or the like. Due to its wear properties, pinning anti-ferromagnetic layer 34 is preferably NiO having a typical thickness of 200–500 Å. First and second ferromagnetic layers 40,42 are preferably Co separated by a Ru coupling film 44 4 Å thick. Spacer layer 30 is preferably a metallic material such as Cu. Magnetically free layer 32 is formed of a ferromagnetic material such as NiFe in the presence of a magnetic field to induce magnetization direction 50 normal to magnetization direction 46. Optionally, free layer 32 may include a Co film to increase GMR performance. A conductive capping layer such as Ta is deposited on free layer 32.

In operation, current source 54 and sensing means 56 are connected to sensor 20 through contacts 58. Fields produced by magnetic media 22 passing sensor 20 change the orientation of magnetization direction 50. This, in turn, changes the resistance through sensor 20 of current produced by current source 54. This change in resistance is converted to an electrical signal by sensing means 56.

Figure 2:
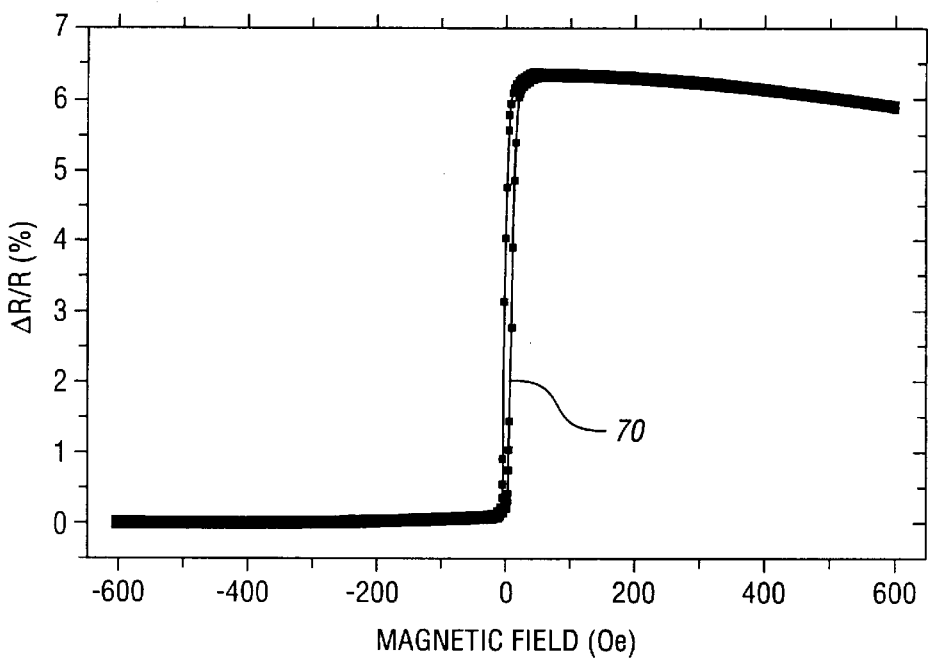
FIG. 2 is a graph of magnetoresistance versus applied magnetic field for the bottom spin valve magnetoresistive sensor of FIG. 1 over a 600 Oe magnetic field excursion.

Referring now to FIG. 2, a graph of magnetoresistance versus applied magnetic field for the bottom spin valve magnetoresistive sensor of FIG. 1 over a 600 Oe magnetic field excursion is shown. Magnetoresistance is expressed as the ratio of change in resistance ($\Delta R$) to the total resistance (R) expressed as a percentage. Magnetoresistance curve 70 shows the response of a device constructed in a manner similar to the method described in U.S. Pat. No. 5,701,223 to a moderately strong applied field. The shape of curve 70 indicates continued pinning of synthetic anti-ferromagnetic layer 38 throughout the range of applied field.

Figure 3:
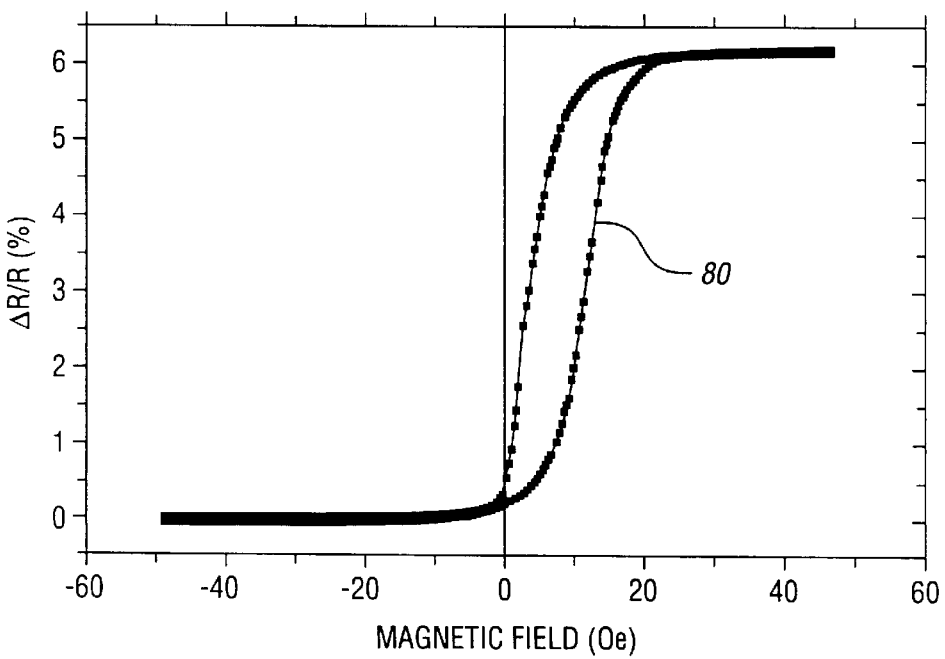
FIG. 3 is a graph of magnetoresistance versus applied magnetic field for the bottom spin valve magnetoresistive sensor of FIG. 1 over a 50 Oe magnetic field excursion.

Referring now to FIG. 3, a graph of magnetoresistance versus applied magnetic field for the bottom spin valve magnetoresistance sensor of FIG. 1 due to a 50 Oe magnetic field excursion is shown. Magnetoresistance curve 80 indicates the response of sensor 20 to an applied field having a strength similar to that produced by magnetic media 22. Sensor 20 exhibits a 6.2% $\Delta R/R$ and a low coercivity of about 4 Oe.

Bottom spin valve magnetoresistive sensor 20 may be used effectively to read field patterns recorded on magnetic media 22. However, several difficulties arise in the manufacture of sensor 20. One problem with this design is the difficulty in achieving proper soft magnetic properties such as low coercivity, low anisotropy, and a well-defined magnetic axis in the free ferromagnetic layer without previously depositing a seed layer directly beneath free layer 32. Another problem is the difficulty controlling the structure and surface quality of NiO anti-ferromagnetic layer 34.

Figure 4:
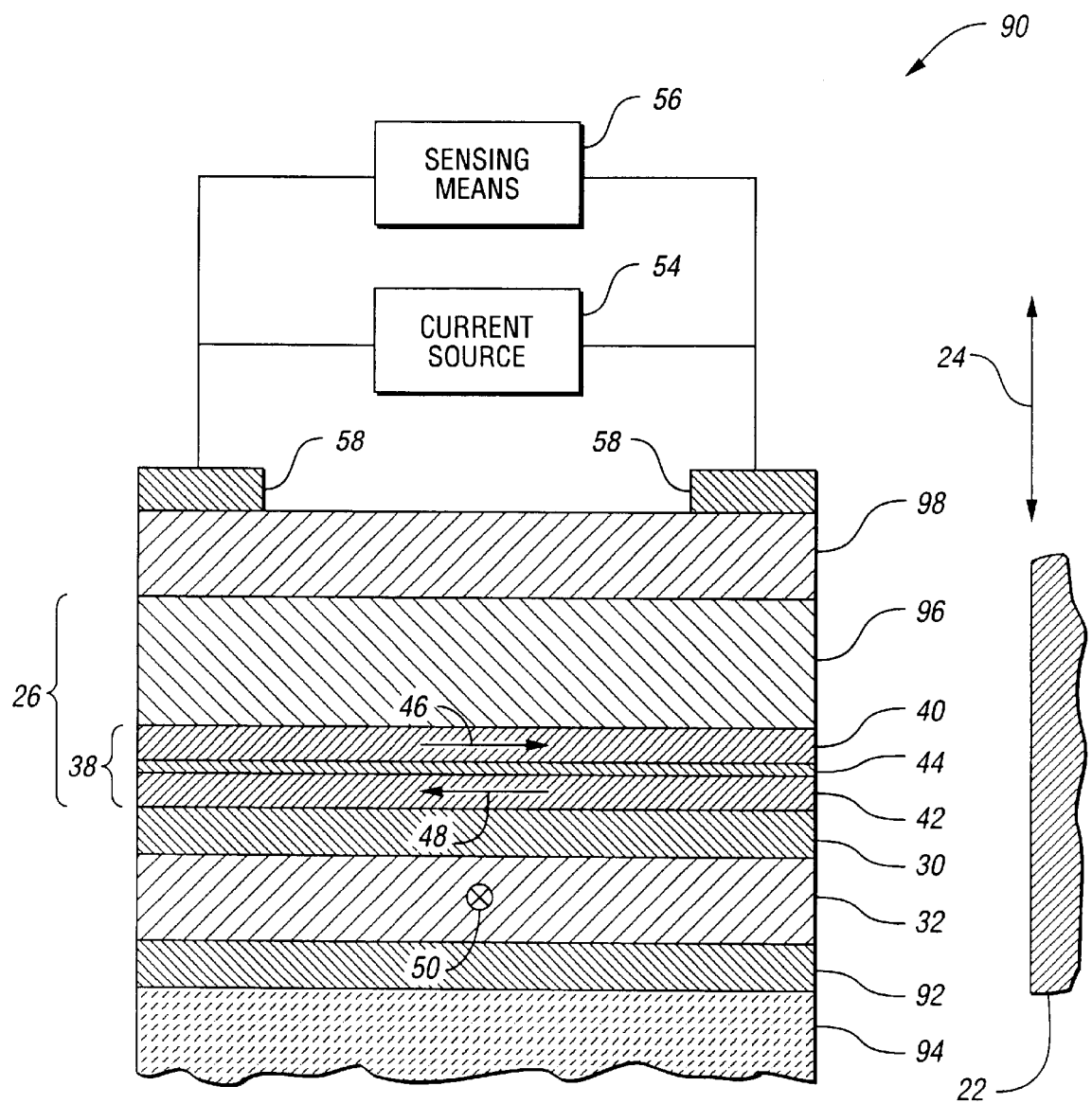
FIG. 4 is a conceptualized sectional view of a top spin valve magnetoresistive sensor.

Referring now to FIG. 4, a conceptualized sectional view of a top spin valve magnetoresistance sensor is shown. Top SVMR sensor 90 reverses the relative positions of the magnetically free layer and the pinned synthetic anti-ferromagnetic layer. Seed layer 92 on substrate 94 simplifies the deposition of free layer 32. Spacer layer 30 is then deposited on free layer 32. Synthetic anti-ferromagnetic layer 38 is then deposited on spacer 30. Pinning anti-ferromagnetic layer 96 is deposited on synthetic anti-ferromagnetic layer 38. Capping layer 98 may then be deposited on pinning anti-ferromagnetic layer 96.

Top SVMR sensor 90 operates in fundamentally the same manner as bottom SVMR sensor 20. Current supplied by current source 54 through contacts 58 experiences resistance which is a function of an externally applied field produced by magnetic media 22. Sensing means 56 converts this changing resistance into an electrical signal.

In U.S. Pat. No. 5,701,223, pinning anti-ferromagnetic layer is described as being an alloy of Fe-Mn and chromium such as $(Fe_{50}Mn_{20})_{97}Cr_3$. While possessing sufficient exchange bias, alloys of Fe—Mn do not possess sufficient wear and corrosion resistance for use in certain applications such as magnetic tape in which the abrasive magnetic tape actually contacts top SVMR sensor 90.

In an attempt to build top SVMR sensor 90 having better wear properties, NiO was substituted for the Fe—Mn alloy in pinning anti-ferromagnetic layer 96. The resulting magnetoresistance curves are described with regards to FIG. 5 and 6 below.

All layers of the film stack forming top SVMR sensor 90 using NiO for pinning anti-ferromagnetic layer 96 were deposited by DC magnetos sputtering from pure and alloy planar targets. The film thickness for each layer was obtained using computer controlled fast-acting shutters as is known in the art. Each layer was created sequentially with only the active material target ignited during deposition.

Seed layer 92 of Ta is first deposited to a thickness of 50 Å. Free layer 32 of NiFe is deposited to a thickness of 75 Å in the presence of a 50 Oersted alternating current (AC) magnetic field applied to substrate 94. Free layer 32 also includes a film of Co deposited to a thickness of 9 Å on the NiFe to enhance the GMR effect and the thermal stability. Spacer layer 30 of Cu is deposited to a thickness of 28 Å. Substrate 94 is now rotated 90° in vacuum to allow for proper orientation of pinned synthetic anti-ferromagnetic layer 26. Second ferromagnetic layer 42 of Co is deposited to a thickness of 30 Å in the presence of a 50 Oersted positive direct current (DC) magnetic field. Coupling film 44 of Ru is deposited to a thickness of 7 Å in the presence of a 50 Oersted positive DC magnetic field. First ferromagnetic layer 40 of Co is deposited to a thickness of 30 Å in the presence of a 50 Oersted positive DC magnetic field. Pinning anti-ferromagnetic layer 96 of NiO is deposited to a thickness of 250 Å without an applied magnetic field. Pinning anti-ferromagnetic layer 96 may be formed by sputtering nickel in a partial pressure of oxygen or by sputtering NiO.

Figure 5:
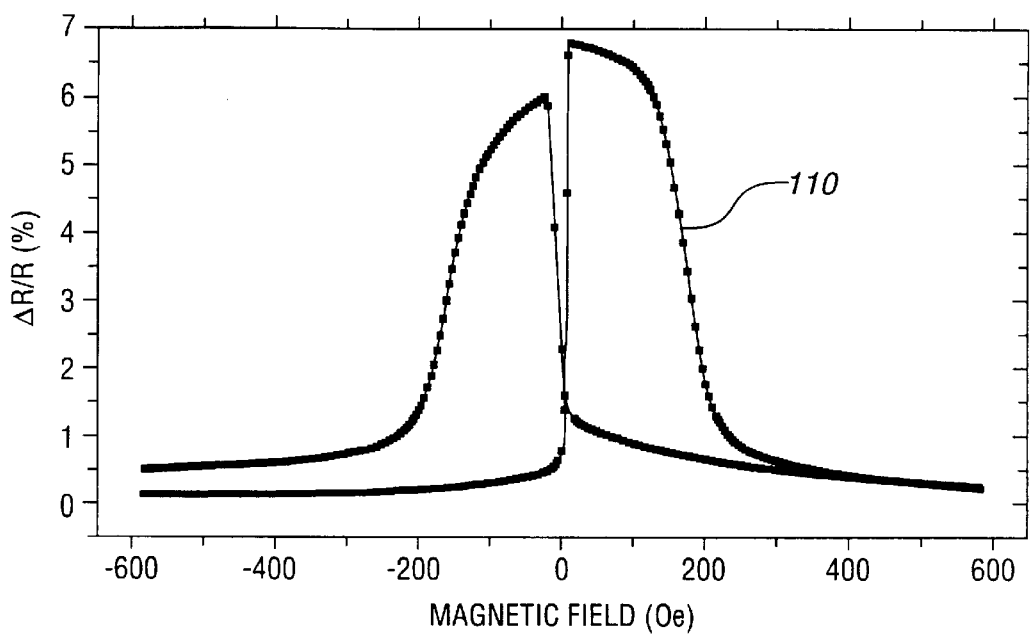
FIG. 5 is a graph of magnetoresistance versus applied magnetic field for the top spin valve magnetoresistive sensor of FIG. 4 having a nickel oxide anti-ferromagnetic pinning layer over a 600 Oe magnetic field excursion illustrating loss of pinning behavior.

Referring now to FIG. 5, a graph of magnetoresistance versus applied magnetic field for the top spin valve magnetoresistive sensor of FIG. 4 having a nickel oxide anti-ferromagnetic pinning layer over a 600 Oe magnetic field excursion illustrating loss of pinning behavior is shown. The shape of magnetoresistance curve 110 indicates that top SVMR sensor 90 is unable to maintain pinning of synthetic anti-ferromagnetic layer 38 in the presence of moderately strong externally applied magnetic fields. This is thought to be due, at least in part, on the oxidation of first ferromagnetic layer 40 during the deposition of NiO for pinning anti-ferromagnetic layer 96.

Figure 6:
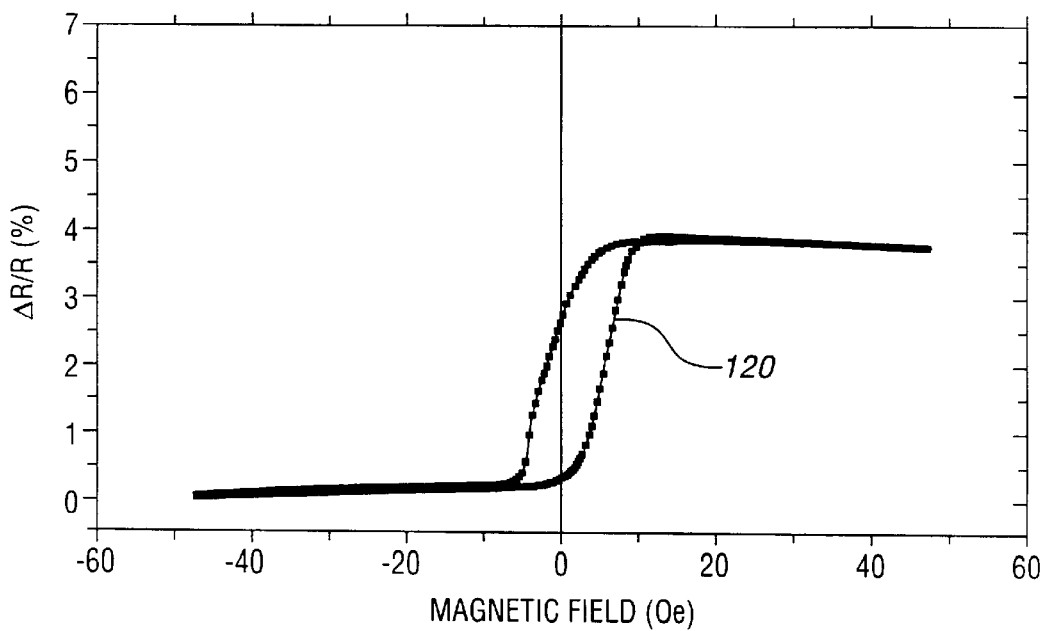
FIG. 6 is a graph of magnetoresistance versus applied magnetic field for the top spin valve magnetoresistive sensor of FIG. 4 having a nickel oxide anti-ferromagnetic pinning layer over a 50 Oe magnetic field excursion after experiencing 600 Oe illustrating high coercivity.

Referring now to FIG. 6, a graph of magnetoresistance versus applied magnetic field for the top spin valve magnetoresistive sensor of FIG. 4 having a nickel oxide anti-ferromagnetic pinning layer over a 50 Oe magnetic field excursion after experiencing 600 Oe illustrating high coercivity is shown. Magnetoresistance curve 120 indicates an unacceptably high coercivity of about 8 Oe. Further, a change in resistance of only about 4% $\Delta R/R$ is observed.

Figure 7:
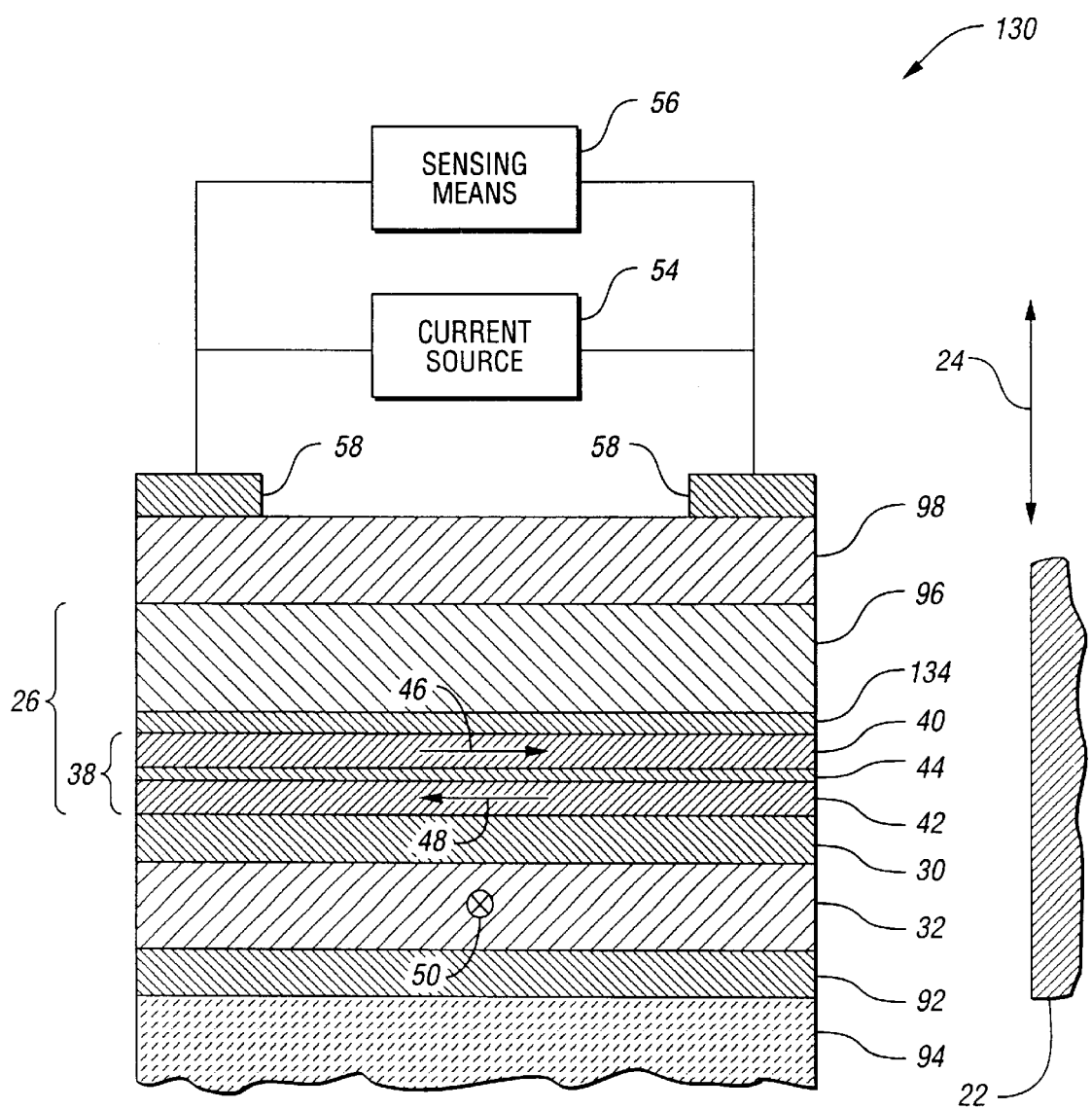
FIG. 7 is a conceptualized sectional view of a top spin valve magnetoresistive sensor according to the present invention.

Referring now to FIG. 7, a conceptualized sectional view of a top spin valve magnetoresistive sensor according to the present invention is shown. An oxidation protection layer which does not disrupt the exchange bias is used between the magnetically pinned layer implemented by synthetic anti-ferromagnetic layer 38 and the magnetically pinning layer implemented by NiO pinning anti-ferromagnetic layer 96.

Pinned synthetic anti-ferromagnet 132 is constructed by first forming synthetic anti-ferromagnetic layer 38. Oxidation protection layer 134 is then deposited on synthetic anti-ferromagnetic layer 38. NiO pinning anti-ferromagnetic layer 96 is then deposited on oxidation layer 134. In a preferred embodiment, oxidation protection layer 134 is a thin film of nickel-iron. Oxide protection layer 134 preferably has a thickness between 3 Å and 30 Å. More preferably, the thickness of oxidation protection layer 134 is 10 Å.

The method used to produce top SVMR sensor 130 is similar to that used to produce top SVMR sensor 90 with the addition of forming oxidation protection layer 134. Oxidation protection layer 134 may be deposited by sputtering from the NiFe source used to form free layer 32.

Figure 8:
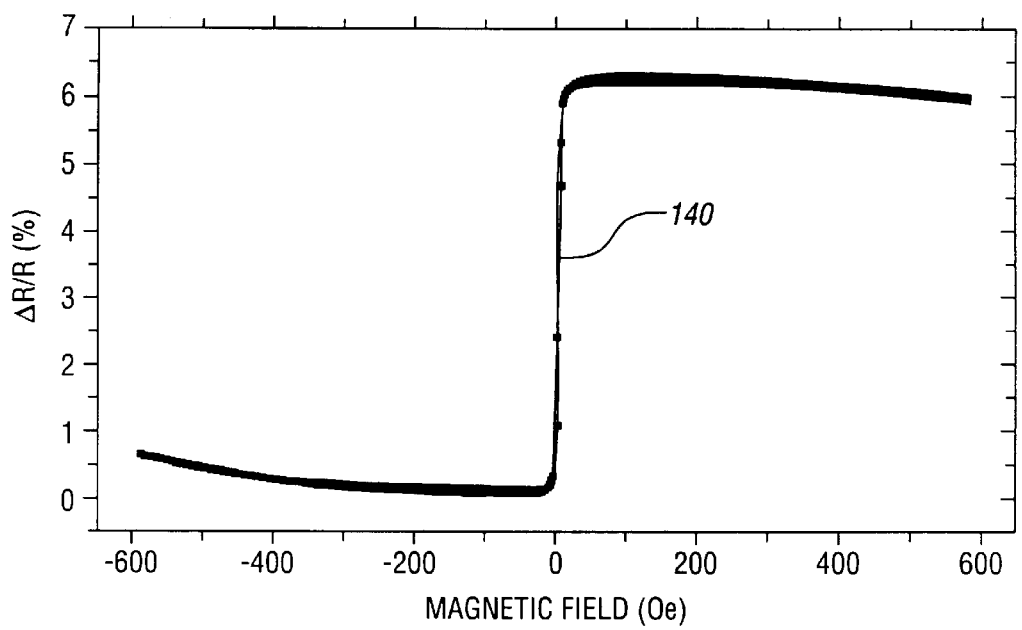
FIG. 8 is a graph of magnetoresistance versus applied magnetic field for the top spin valve magnetoresistive sensor of FIG. 7 over a 600 Oe magnetic field excursion.

Referring now to FIG. 8, a graph of magnetoresistance versus applied magnetic field for the top spin valve magnetoresistive sensor of FIG. 7 over a 600 Oe magnetic field excursion is shown. The shape of magnetoresistance curve 140 indicates that synthetic anti-ferromagnetic layer 38 remains pinned throughout a range of moderately strong applied magnetic fields.

Figure 9:
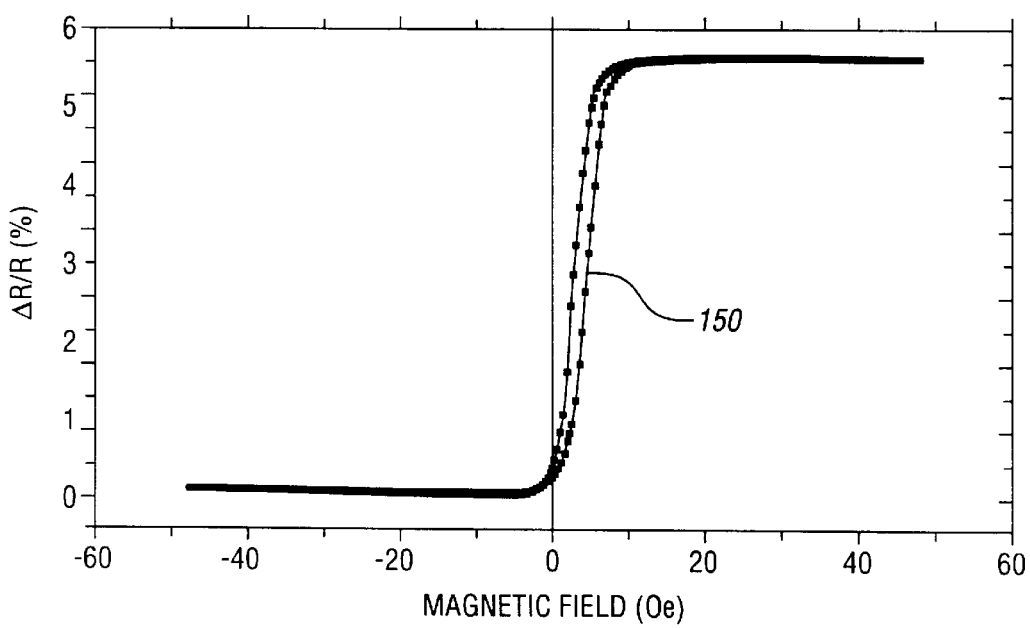
FIG. 9 is a graph of magnetoresistance versus applied magnetic field for the top spin valve magnetoresistive sensor of FIG. 7 over a 50 Oe magnetic field excursion.

Referring now to FIG. 9, a graph of magnetoresistance versus applied magnetic field for the top spin valve magnetoresistive sensor of FIG. 7 over a 50 Oe magnetic field excursion is shown. Magnetoresistance curve 150 indicates that top SVMR sensor 130 has a change in resistance of 6.2% ΔR/R over the range of applied field strengths typically produced by magnetic media 22. Top SVMR sensor 130 also exhibits a low coercivity of 1.0 Oe.

While the best mode for carrying out the invention has been described in detail, other possibilities exist within the spirit and scope of the present invention. Those familiar with the art to which this invention relates will recognize various alternative designs and embodiments for practicing the invention as defined by the following claims.

What is claimed is:

1. A pinned synthetic anti-ferromagnet comprising:
   a synthetic anti-ferromagnet;
   an oxidation protection layer deposited on the synthetic anti-ferromagnet; and
   a nickel oxide layer deposited on the oxidation layer operative to pin the synthetic anti-ferromagnet.

2. A pinned synthetic anti-ferromagnet as in claim 1 wherein the oxidation protection layer comprises nickel-iron (NiFe).

3. A pinned synthetic anti-ferromagnet as in claim 1 wherein the oxidation protection layer is between 3 angstroms and 30 angstroms in thickness.

4. A pinned synthetic anti-ferromagnet as in claim 3 wherein the oxidation protection layer is about 10 angstroms.

5. A top spin valve magnetoresistive sensor comprising:
   a substrate;
   a seed layer deposited on the substrate;
   a magnetically free layer deposited on the seed layer;
   spacer layer deposited on the free layer;
   a magnetically pinned layer deposited on the spacer layer;
   an oxidation protection layer deposited on the pinned layer; and
   a magnetically pinning layer deposited on the oxidation protection layer, the pinning layer including, an oxide.

6. A top spin valve magnetoresistive sensor as in claim 5 wherein the pinning layer comprises nickel oxide (NiO).

7. A top spin valve magnetoresistive sensor as in claim 5 wherein the oxide protection layer comprises nickel-iron (NiFe).

8. A top spin valve magnetoresistive sensor as in claim 5 wherein the oxide protection layer has a thickness between 3 angstroms and 30 angstroms.

9. A top spin valve magnetoresistive sensor as in claim 8 wherein the oxide protection layer has a thickness of about 10 angstroms.

10. A top spin valve magnetoresistive sensor as in claim 5 wherein the pinned layer comprises:
    a first cobalt (Co) layer deposited on the spacer layer;
    a ruthenium (Ru) layer deposited on the first cobalt layer; and
    a second cobalt (Co) layer deposited on the ruthenium layer.

11. A method of making a pinned synthetic anti-ferromagnet comprising:
    forming a synthetic anti-ferromagnet;
    depositing an oxidation protection layer on the synthetic anti-ferromagnet, and
    depositing a nickel oxide (NiO) layer on the oxidation.

12. A method of making a pinned synthetic anti-ferromagnet as in claim 11 wherein depositing the oxidation protection layer comprises depositing a thin layer of nickel-iron (NiFe).

13. A method of making a pinned synthetic anti-ferromagnet as in claim 12 wherein the oxidation protection layer has a thickness between 3 angstroms and 30 angstroms.

14. A method of making a pinned synthetic anti-ferromagnet as in claim 13 wherein the oxidation protection layer is about 10 angstroms thick.

15. A method of making a pinned synthetic anti-ferromagnet as in claim 11 wherein depositing the nickel oxide layer comprises sputtering nickel in a partial pressure of oxygen.

16. A method of making a pinned synthetic anti-ferromagnet as in claim 11 wherein depositing the nickel oxide layer comprises sputtering nickel oxide.

* * * * *